Figure 1:
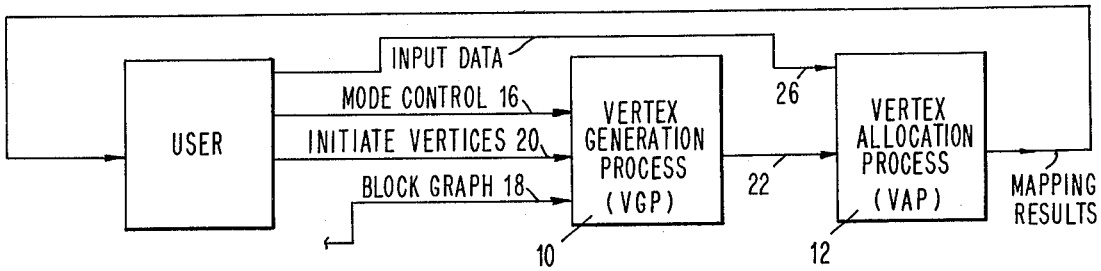
Figure 4:
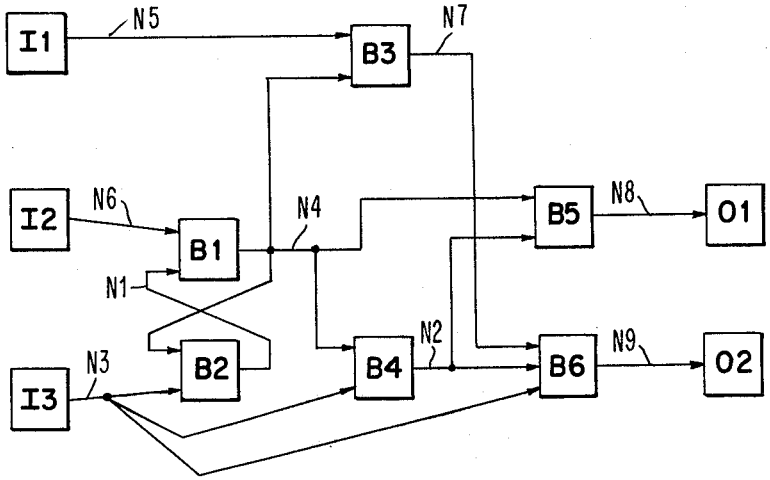
Figure 4A:
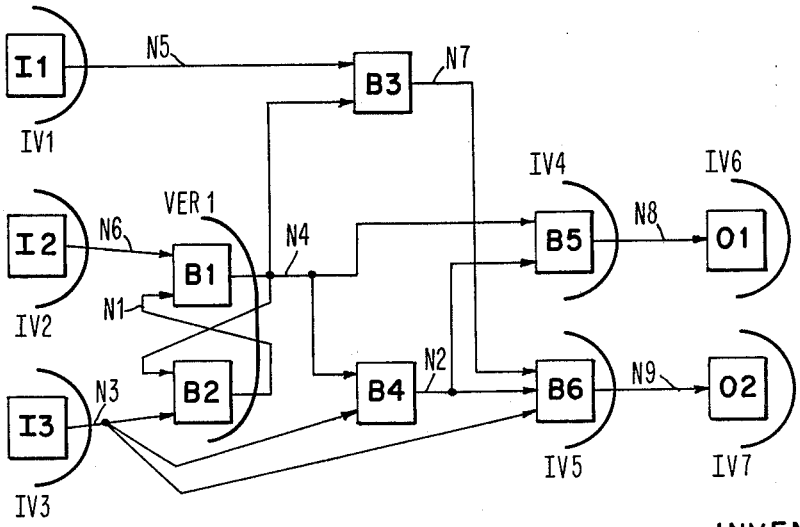
Figures 2, 2A:
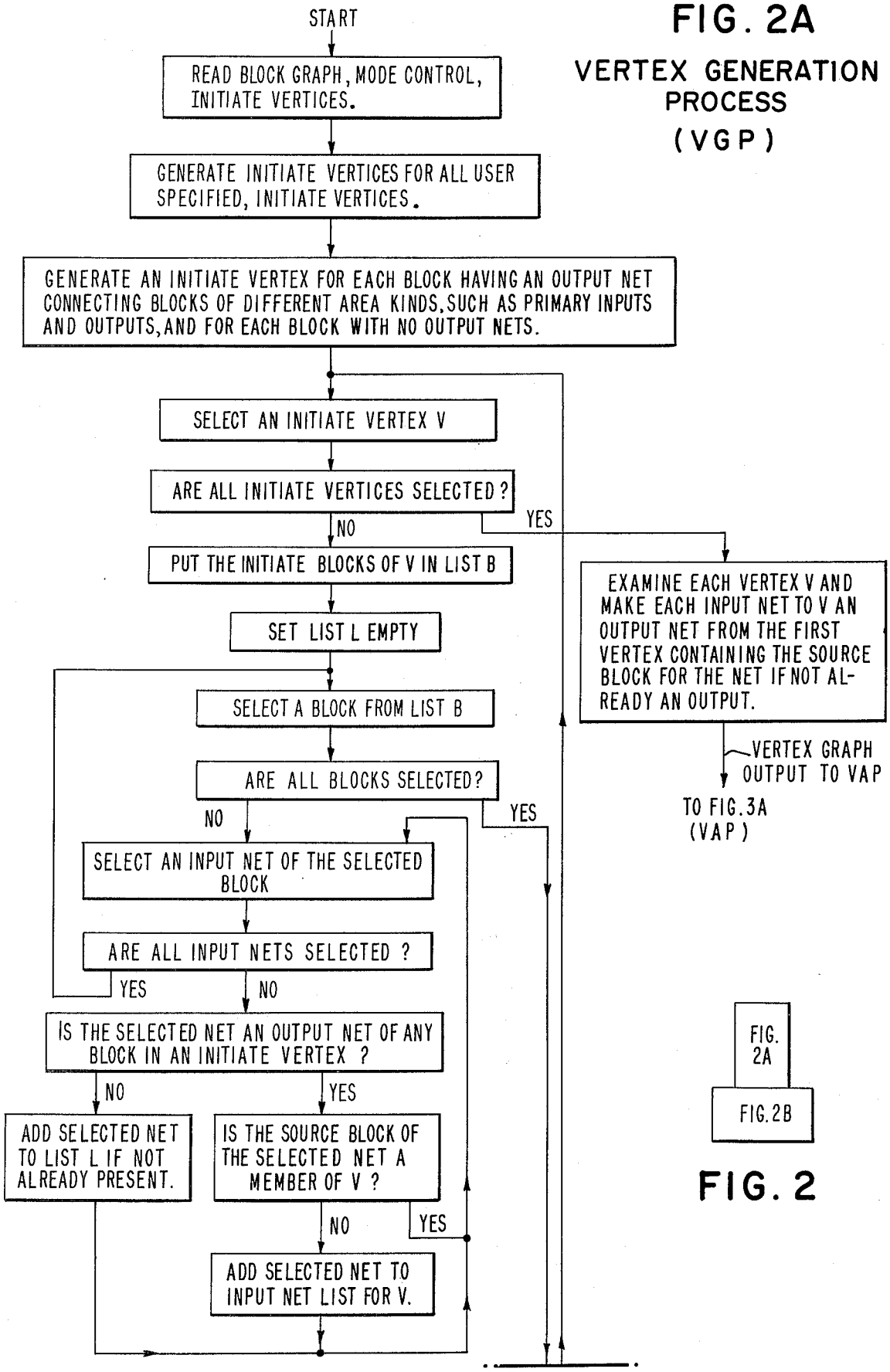
Figure 2B:
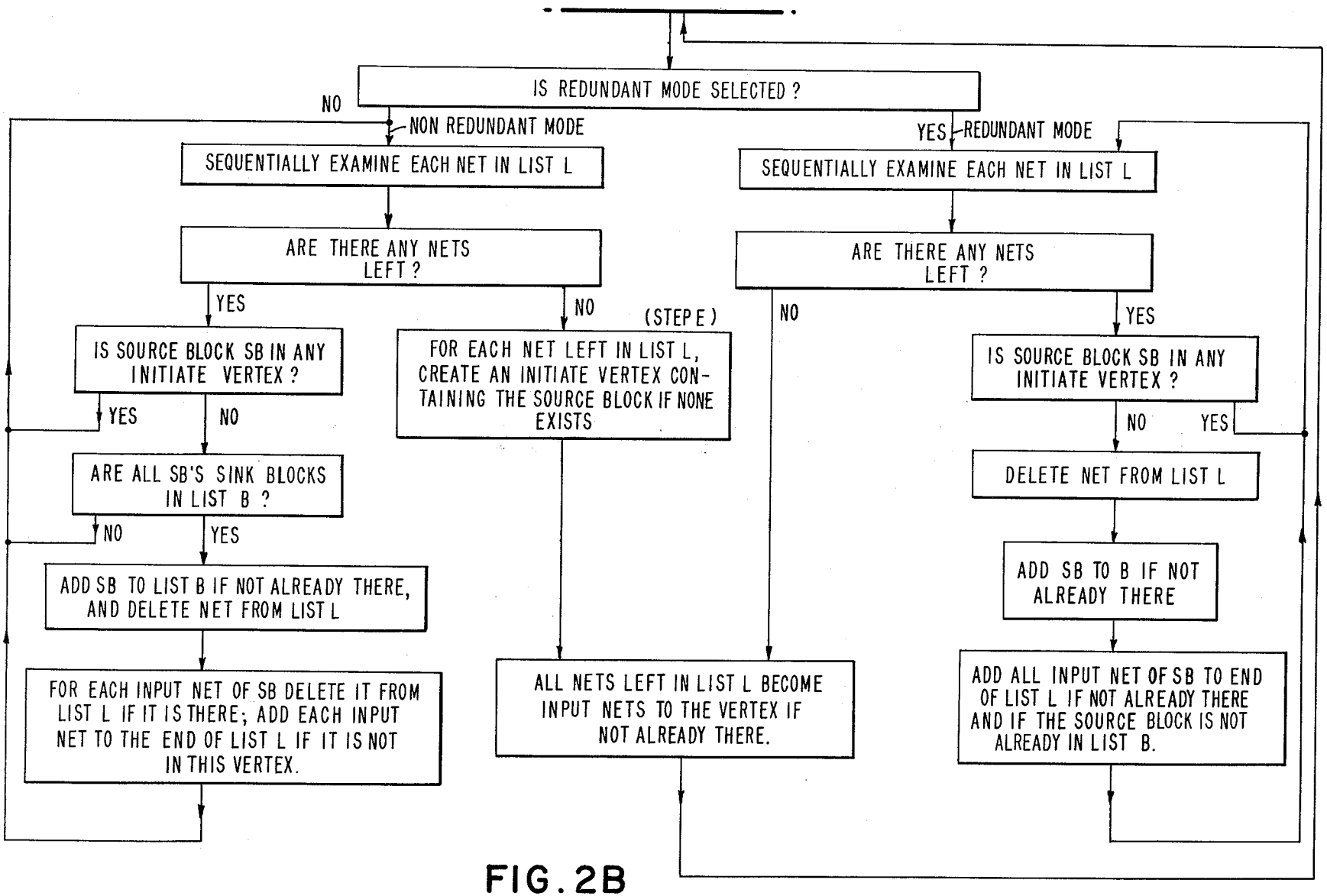
Figures 3, 3A:
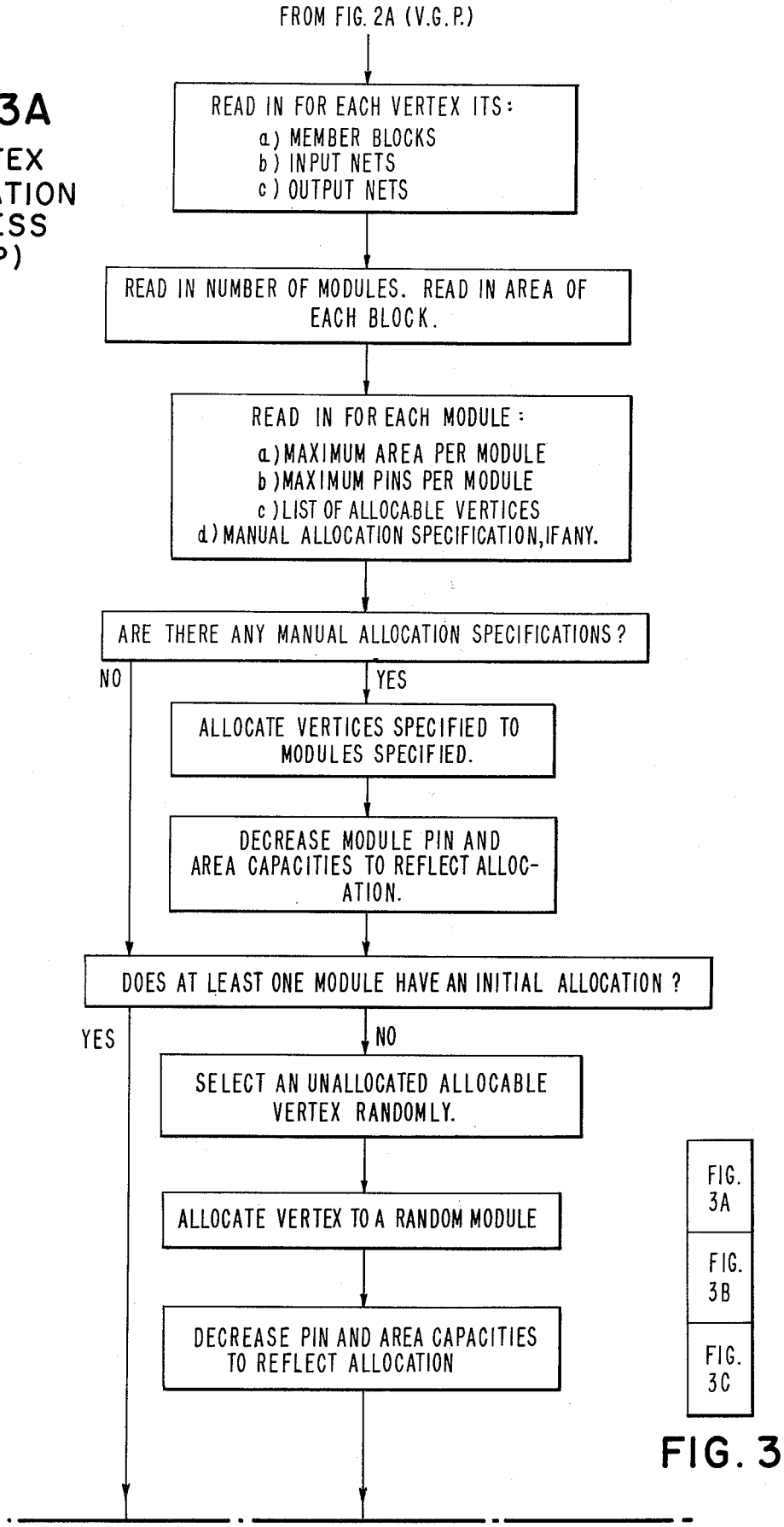
Figure 3B:
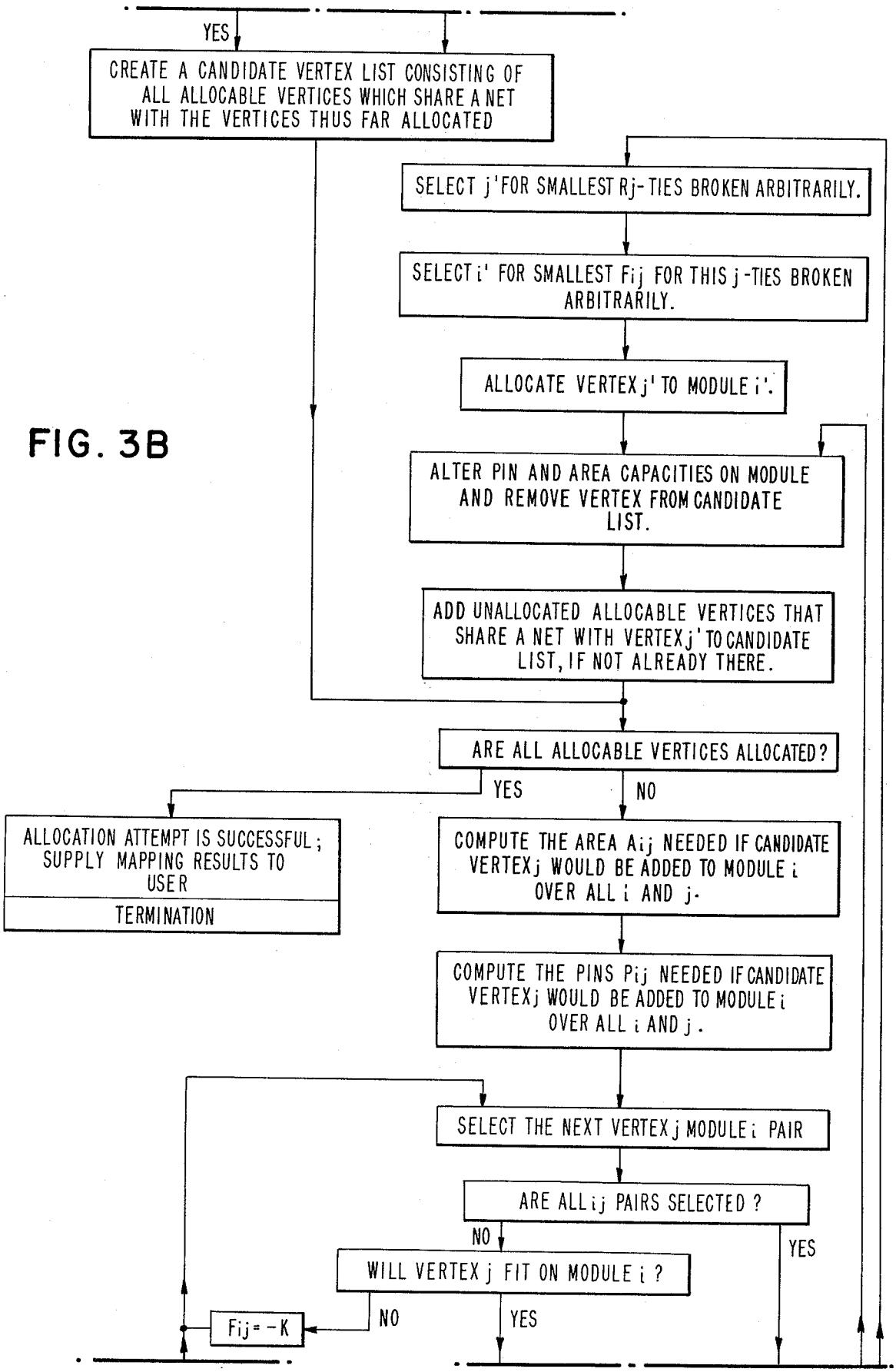
Figure 3C:
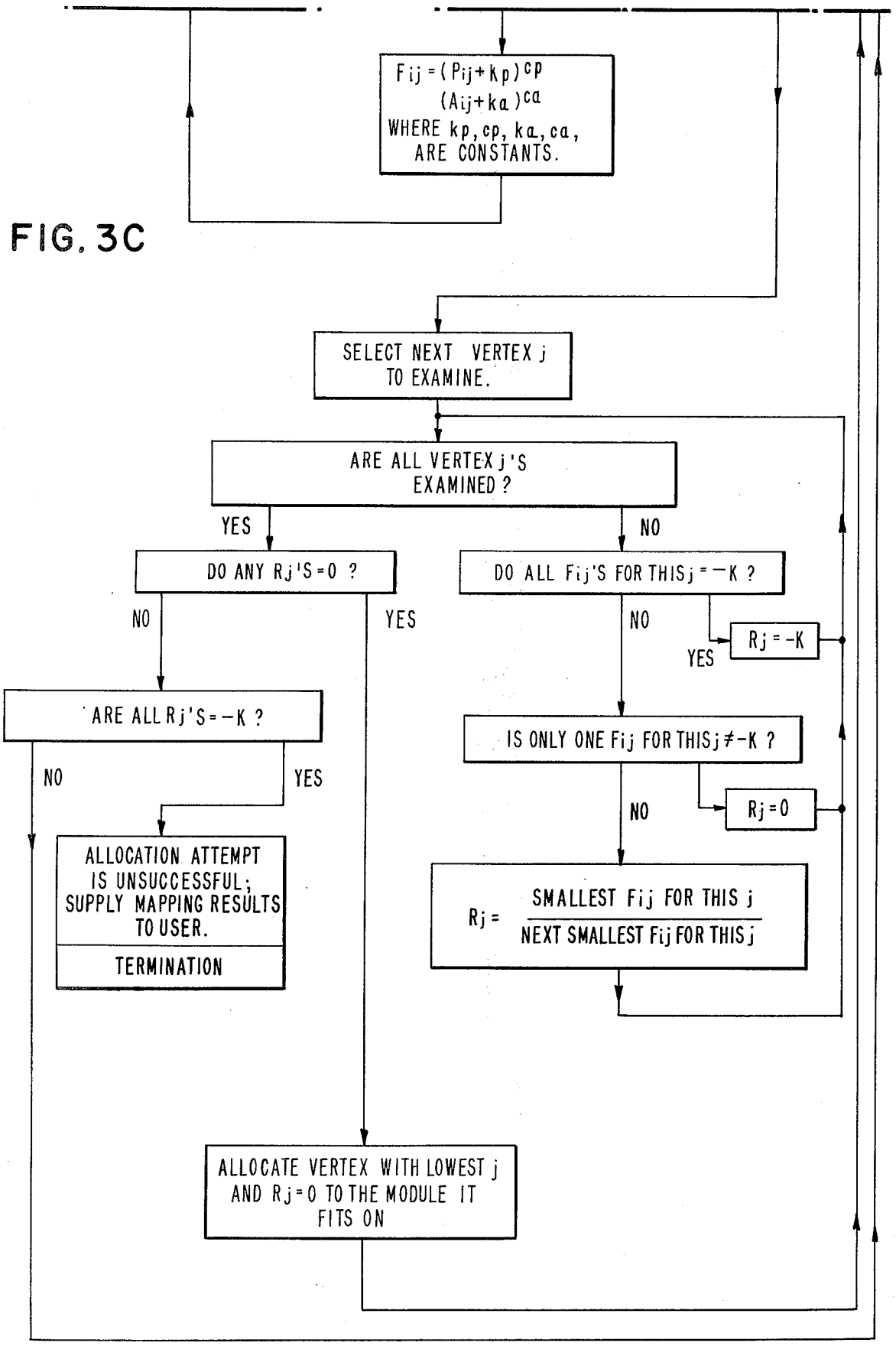
Figure 5:
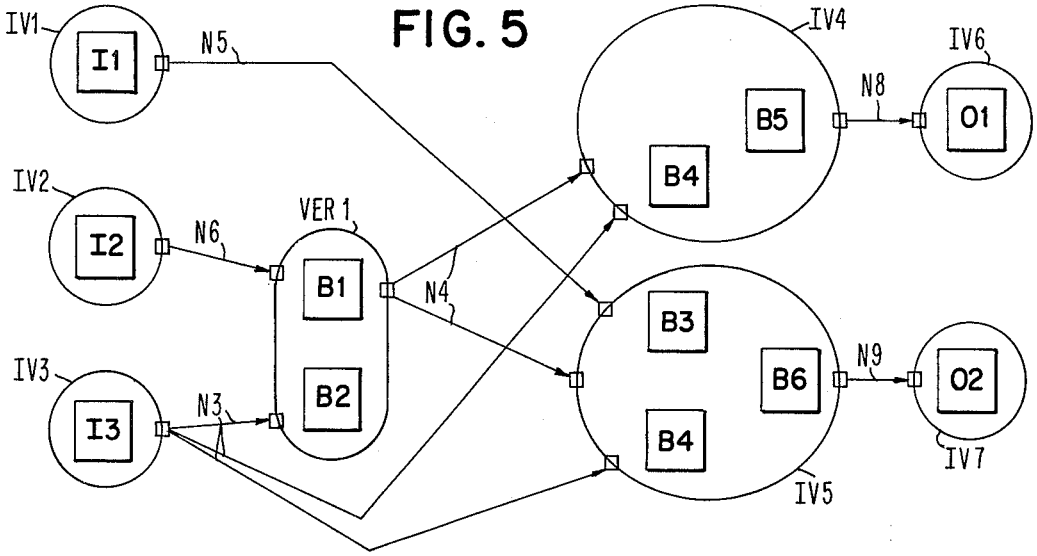
Figure 6:
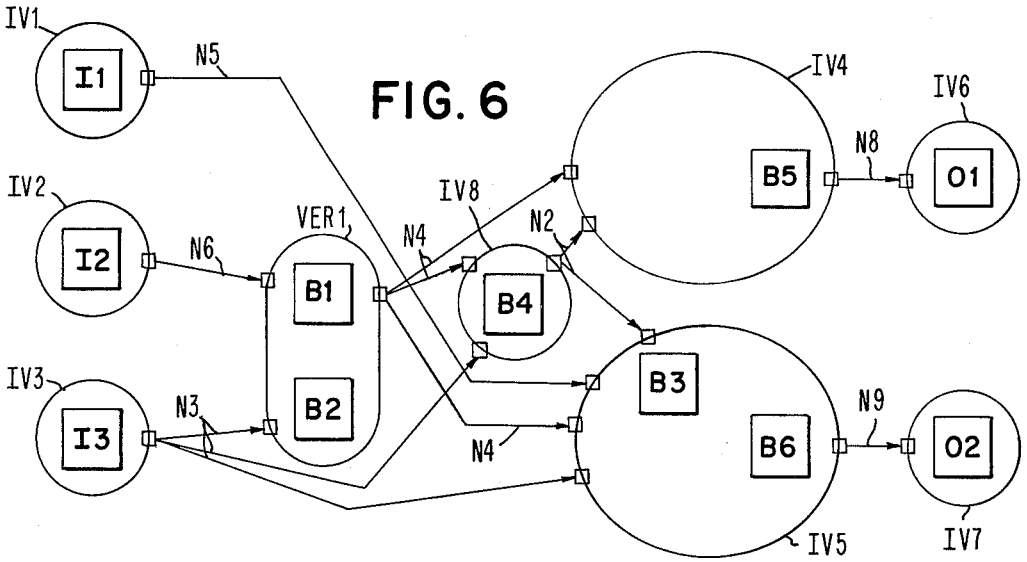
Figure 7:
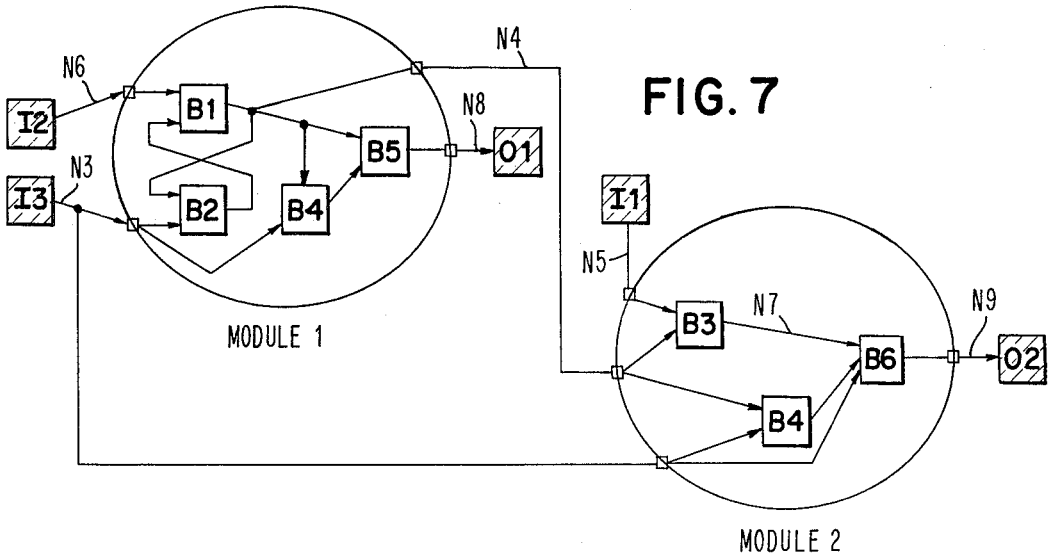

DEFENSIVE PUBLICATION

UNITED STATES PATENT AND TRADEMARK OFFICE

Published at the request of the applicant or owner in accordance with the Notice of Dec. 16, 1969, 869 O.G. 687. The abstracts of Defensive Publication applications are identified by distinctly numbered series and are arranged chronologically. The heading of each abstract indicates the number of pages of specification, including claims and sheets of drawings contained in the application as originally filed. The files of these applications are available to the public for inspection and reproduction may be purchased for 30 cents a sheet.

Defensive Publication applications have not been examined as to the merits of alleged invention. The Patent and Trademark Office makes no assertion as to the novelty of the disclosed subject matter.

PUBLISHED NOVEMBER 4, 1975

940 O.G. 7

T940,008

AUTOMATED LOGIC MAPPING SYSTEM

Peter H. Oden, 120 Pines Bridge Road, Ossining, N.Y. 10562; Roy L. Russo, 1793 Blossom Court, Yorktown Heights, N.Y. 10598; and Peter K. Wolff, Sr., Glen Road, P.O. Box 426, Shrub Oak, N.Y. 10588

Continuation of application Ser. No. 300,954, Oct. 26, 1972. This application May 17, 1974, Ser. No. 470,871

Int. Cl. G06f *9/06, 13/00*

U.S. Cl. 444—1

8 Sheets Drawing. 34 Pages Specification

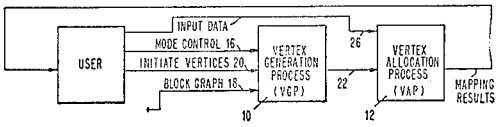

A process for allocating a plurality of block units with a predescribed interconnection specification, to a plurality of module units. The allocation process may be varied from a partition having a zero block redundancy, to a mapping which has some degree of redundancy for the purpose of minimizing the total number of modules required. The process is applicable to any system wherein interconnected block sub-units must be assigned to larger module units for organizational purposes. For example, the allocation of circuits to chip structures.

In the present invention an automatic process for mapping blocks to modules is provided. The process consists of a set of programs that operate on a given block graph input and provide an output graph which may take the form of either a partition or a mapping.

The automated mapping process consists of two major constituents, a vertex generation program (VGP) and a vertex allocation program (VAP). Vertex generation is a sub-grouping process to commonly assign interconnected blocks into a subunit known as a vertex. The program begins with a list of initiate vertices to which blocks are added until a complete list of vertices is formed. The initiate vertex acts as a nucleus from which the vertex is grown. The VGP terminates by outputting a complete vertex graph that is introduced as input to VAP.

The vertex allocation phase performs a systematic assignment of vertices to modules. VAP structures the input vertex graph into a format which may be processed to determine which of the vertices may be assigned to a common module. In order to achieve a minimized cost mapping, VAP may be used iteratively by the user so as to execute a mapping onto a predetermined number of modules in accordance with a plurality of structure and user restrictions.

INVENTORS
PETER H. ODEN
ROY L. RUSSO
PETER K. WOLFF, SR.

BY Victor Siber

AGENT

VERTEX GENERATION PROCESS (VGP)

VERTEX ALLOCATION PROCESS (VAP)

| | AREA | PINS |
|---|---|---|
| MODULE 1 | 2 | 1 |
| MODULE 2 | 4 | 4 |

FIG. 8

| | VER1 | IV5 |
|---|---|---|
| MODULE 1 | 1 | 2 |
| MODULE 2 | 3 | 4 |

PINS Pij

FIG. 9

| | VER1 | IV5 |
|---|---|---|
| MODULE 1 | 2 | 2 |
| MODULE 2 | 2 | 3 |

AREA Aij

FIG. 10

| | VER1 | IV5 |
|---|---|---|
| MODULE 1 | 132 | -K |
| MODULE 2 | 156 | 182 |

Fij

FIG. 11A

| VER 1 | IV5 |
|---|---|
| 132 | 144 |
| 156 | 182 |

Fij

FIG. 11B

| | VER1 | IV5 |
|---|---|---|
| R | $\frac{132}{156}$ | 0 |

FIG. 12A

| | VER 1 | IV5 |
|---|---|---|
| R | $\frac{132}{156} \approx .85$ | $\frac{144}{182} \approx .78$ |

FIG. 12B